(12) United States Patent
Dumont et al.

(10) Patent No.: US 12,199,211 B2
(45) Date of Patent: Jan. 14, 2025

(54) PROCESS FOR FABRICATING A DETECTING DEVICE THE GETTER OF WHICH IS BETTER PROTECTED

(71) Applicant: COMMISSARIAT À L'ENERGIE ATOMIQUE ET AUX ENERGIES ALTERNATIVES, Paris (FR)

(72) Inventors: Geoffroy Dumont, Grenoble (FR); Laurent Carle, Grenoble (FR); Jean-Jacques Yon, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 435 days.

(21) Appl. No.: 17/778,773

(22) PCT Filed: Nov. 19, 2020

(86) PCT No.: PCT/EP2020/082703
§ 371 (c)(1),
(2) Date: May 20, 2022

(87) PCT Pub. No.: WO2021/099477
PCT Pub. Date: May 27, 2021

(65) Prior Publication Data
US 2022/0416113 A1 Dec. 29, 2022

(30) Foreign Application Priority Data
Nov. 22, 2019 (FR) ........................................ 1913138

(51) Int. Cl.
*H01L 31/18* (2006.01)
*G01J 5/02* (2022.01)
(Continued)

(52) U.S. Cl.
CPC .......... *H01L 31/1892* (2013.01); *G01J 5/024* (2013.01); *G01J 5/045* (2013.01);
(Continued)

(58) Field of Classification Search
CPC . H01L 31/1892; H01L 21/467; H01L 21/568; H01L 27/14649; H01L 27/14683; H01L 31/1868; G01J 5/024; G01J 5/045
See application file for complete search history.

(56) References Cited

U.S. PATENT DOCUMENTS 10,825,936 B2 * 11/2020 Frey ........................ G02B 5/288
2006/0043297 A1 * 3/2006 Ouvrier-Buffet ......... G01J 5/04
250/339.05

(Continued)

OTHER PUBLICATIONS

International Search Report issued Jan. 26, 2021 in PCT/EP2020/082703, 2 pages.

(Continued)

*Primary Examiner* — Earl N Taylor
(74) *Attorney, Agent, or Firm* — Oblon, McClelland, Maier & Neustadt, L.L.P.

(57) ABSTRACT

A process for fabricating a detecting device includes producing a getter pad based on amorphous carbon resting on a mineral sacrificial layer that covers a thermal detector and producing a thin encapsulating layer that rests on the mineral sacrificial layer and that covers an upper face and sidewalls of the getter pad. The mineral sacrificial layer is removed via a first chemical etch, and a protective segment of the getter pad is removed via a second chemical etch.

16 Claims, 9 Drawing Sheets

(51) Int. Cl.
*G01J 5/04* (2006.01)
*H01L 21/467* (2006.01)
*H01L 21/56* (2006.01)
*H01L 27/146* (2006.01)

(52) U.S. Cl.
CPC .......... *H01L 21/467* (2013.01); *H01L 21/568* (2013.01); *H01L 27/14649* (2013.01); *H01L 27/14683* (2013.01); *H01L 31/1868* (2013.01)

(56) References Cited

U.S. PATENT DOCUMENTS

| | | | | |
|---|---|---|---|---|
| 2010/0314544 | A1* | 12/2010 | Ouvrier-Buffet | G01J 5/04 257/E31.127 |
| 2012/0097853 | A1* | 4/2012 | Ouvrier-Buffet | G01J 5/068 250/349 |
| 2012/0153151 | A1* | 6/2012 | Dumont | G01J 5/0803 250/338.1 |
| 2014/0097343 | A1* | 4/2014 | Gidon | G01J 3/45 250/339.02 |
| 2014/0248735 | A1* | 9/2014 | Purkl | H01L 31/18 438/64 |
| 2016/0023888 | A1 | 1/2016 | Quevy et al. | |
| 2016/0023889 | A1 | 1/2016 | Quevy et al. | |
| 2016/0025664 | A1 | 1/2016 | Quevy et al. | |
| 2016/0245701 | A1* | 8/2016 | Yon | G01J 5/34 |
| 2016/0355397 | A1 | 12/2016 | Quevy et al. | |
| 2016/0362295 | A1 | 12/2016 | Quevy et al. | |
| 2017/0197822 | A1 | 7/2017 | Quevy et al. | |
| 2017/0207265 | A1* | 7/2017 | Vilain | H01L 27/1462 |
| 2017/0241840 | A1* | 8/2017 | Pocas | H01L 27/14687 |
| 2017/0309758 | A1* | 10/2017 | Frey | H01L 31/02165 |
| 2017/0317137 | A1* | 11/2017 | Yon | G01J 5/20 |
| 2018/0321087 | A1* | 11/2018 | Leduc | G01J 5/20 |
| 2019/0051787 | A1* | 2/2019 | Leduc | G01J 5/045 |
| 2020/0115225 | A1* | 4/2020 | Yon | G01J 5/045 |
| 2022/0291044 | A1* | 9/2022 | Dumont | G01J 5/10 |

OTHER PUBLICATIONS

French Search Report issued Oct. 19, 2020 in French Patent Application No. 1913138, 2 pages.

\* cited by examiner

PROCESS FOR FABRICATING A DETECTING DEVICE THE GETTER OF WHICH IS BETTER PROTECTED

TECHNICAL FIELD

The field of the invention is that of devices for detecting electromagnetic radiation, particularly infrared or terahertz radiation, comprising at least one thermal detector encapsulated in a hermetic cavity, in which a getter material is also located. The invention is applicable, notably, to the field of infrared imaging and thermography.

PRIOR ART

A device for detecting electromagnetic radiation, for example infrared or terahertz radiation, may comprise a matrix array of thermal detectors, each comprising an absorbent segment able to absorb the electromagnetic radiation to be detected.

With the aim of ensuring the thermal insulation of the thermal detectors, the absorbent segments usually take the form of membranes that are suspended above the substrate by anchoring pillars, and thermally insulated from the substrate by holding and thermally insulating arms. These anchoring pillars and holding arms also have an electrical function, electrically connecting the suspended membranes to a readout circuit that is usually located in the substrate.

The readout circuit usually takes the form of a CMOS circuit. It allows a control signal to be applied to the thermal detectors and detection signals generated by the latter in response to the absorption of the electromagnetic radiation to be detected to be read. The readout circuit comprises various electrical interconnect levels formed by metal lines separated from one another by dielectric layers, which are called inter-metal layers. At least one electrical connecting pad of the readout circuit is placed on the substrate in such a way that contact may be made thereto from outside the detecting device.

Document EP3239670A1 describes a process for fabricating a detecting device the thermal detectors of which are arranged in a hermetic cavity. This process uses mineral sacrificial layers to produce the thermal detectors and the encapsulating structure defining the cavity, these layers subsequently being removed via a wet chemical etch. The cavity is bounded by a thin encapsulating layer that extends above and around the one or more thermal detectors. It is produced by depositing an upper mineral sacrificial layer on the upper face and in trenches that extend through the mineral sacrificial layers. Thus, the thin encapsulating layer is formed from an upper wall that rests on the upper mineral sacrificial layer, and from a peripheral wall that rests on the substrate and encircles the one or more thermal detectors in a plane parallel to the substrate. This configuration notably allows the footprint on the substrate of the encapsulating structure to be decreased.

Furthermore, the fabricating process described in this document makes provision to produce a segment of a getter material, titanium for example, in the hermetic cavity. This getter segment is then located under each absorbent membrane, and is protected from the wet chemical etch by a thin carbon-containing sacrificial layer, which is for example made of amorphous carbon, and which is subsequently removed via a specific dry chemical etch.

However, there is a need to reinforce the protection of the getter material during the removal of the mineral sacrificial layers via the wet chemical etch, while keeping the footprint on the substrate of the encapsulating structure small.

DISCLOSURE OF THE INVENTION

The objective of the invention is to at least partially remedy the drawbacks of the prior art. To this end, one subject of the invention is a process for fabricating a device for detecting electromagnetic radiation comprising the following steps:
  producing at least one thermal detector intended to detect the electromagnetic radiation, said detector resting on a substrate and being covered by a mineral sacrificial layer made of a mineral material that is able to be removed by a first chemical etch;
  producing at least one pad referred to as the getter pad, this pad:
    extending partially on the mineral sacrificial layer, and being placed away from the thermal detector in a plane parallel to the substrate,
    being formed from a stack of segments of thin planar layers that are parallel to one another, including a protective segment made of amorphous carbon able to be removed via a second chemical etch and resting in contact with the minimal sacrificial layer, and at least one getter segment made of a getter material resting in contact with the protective segment;
  producing a thin encapsulating layer extending above the thermal detector, this layer comprising an upper portion that rests on the mineral sacrificial layer and that covers an upper face and sidewalls of the getter pad;
  producing at least one first vent through the thin encapsulating layer, said vent being located away from the getter pad in a plane parallel to the substrate and opening onto the mineral sacrificial layer;
  removing the mineral sacrificial layer via the first chemical etch, thus freeing a surface of the protective segment;
  removing the protective segment via a second chemical etch, thus freeing a surface of the getter segment;
  depositing a thin sealing layer on the thin encapsulating layer, so as to block at least the first vent.

By removing the mineral sacrificial layer via the first chemical etch, what is meant is at least partial removal of this layer, so as to free a surface of the protective segment.

The following are certain preferred but nonlimiting aspects of this fabricating process.

The fabricating process may comprise a step of producing at least one compensating detector intended not to receive the electromagnetic radiation to be detected, the getter pad being placed facing the compensating detector.

A plurality of thermal detectors and of compensating detectors may be produced, at least one getter pad being placed facing the compensating detectors.

The thermal detector and the compensating detector may each comprise a membrane suspended above the substrate via anchoring pillars, the thin encapsulating layer comprising at least one supporting pillar that is integrally formed with the upper portion, and that extends from the upper portion to rest on an anchoring pillar.

The fabricating process may comprise a step of producing a layer made of an electrically insulating material, said layer being placed between and in contact with the supporting pillar and the anchoring pillar.

Following the step of producing a thin encapsulating layer, the thin encapsulating layer may extend continuously above and around the thermal detector, and be formed from the upper portion and from a peripheral portion, which portions are then integrally formed, the peripheral portion of the thin encapsulating layer extending into a trench produced through the mineral sacrificial layer and making contact with the sidewalls thereof, the peripheral portion resting on the substrate.

The getter pad may comprise a plurality of getter segments that are superposed along an axis perpendicular to the substrate, each being placed between two protective segments.

The getter segment may entirely cover a face of the protective segment opposite the substrate.

In the step of producing the first vent, at least one second vent may be produced through the thin encapsulating layer so as to open onto an upper protective segment that covers said getter segments, then, following the step of removing the mineral sacrificial layer, an aperture may be produced from the second vent so as to open onto a lower protective segment, on which said getters segments rest.

A second thin sealing layer may be deposited so as to block the second vent, this second thin sealing layer being distinct from the thin sealing layer blocking the first vent.

The getter pad may comprise a plurality of getter segments and a plurality of protective segments, these segments being superposed along an axis perpendicular to the substrate. A lateral over-etch of the protective segments may be carried out selectively with respect to the getter segments.

The mineral sacrificial layer may be made of a silicon oxide obtained from a tetraethyl orthosilicate.

Moreover, during the production of the at least one thermal detector, the latter may rest on a first mineral sacrificial layer, the thermal detector and the first mineral sacrificial layer being covered by a second mineral sacrificial layer, the first and second mineral sacrificial layers being made of a mineral material able to be removed via the first chemical etch. The first vent may be placed facing the thermal detector or where appropriate facing a matrix array of thermal detectors. During the first chemical etch, the latter possibly being a wet etch in an acid medium, the first and second mineral sacrificial layers may be partially removed through the first vent, an unetched segment of the first and second mineral sacrificial layers forming a peripheral wall which encircles the thermal detector (or the matrix array of thermal detectors, where appropriate) in a plane parallel to the substrate. The upper portion of the encapsulating layer rests on and makes contact with the peripheral wall.

Following the first chemical etch, the peripheral wall may comprise a lateral recess that causes the cavity to widen vertically parallel to the readout substrate, between the readout substrate and the upper portion, this lateral recess defining an intermediate region of a surface of the readout substrate encircling the thermal detector or where appropriate a matrix array of thermal detectors.

The process may comprise a step of producing reinforcing pillars for reinforcing the thin encapsulating layer, said pillars being arranged in the intermediate region around the thermal detector or where appropriate a matrix array of thermal detectors, being separate from one another, and extending from the upper portion to rest on the readout substrate. The reinforcing pillars may rest directly on the substrate, and therefore make contact therewith, or rest indirectly on the substrate, and for example make contact with anchoring pillars.

BRIEF DESCRIPTION OF THE DRAWINGS

Other aspects, aims, advantages and features of the invention will become more clearly apparent from the following detailed description of preferred embodiments thereof, which description is given by way of non-limiting example and with reference to the appended drawings, in which.

DETAILED DISCLOSURE OF PARTICULAR EMBODIMENTS

Figure 1A:
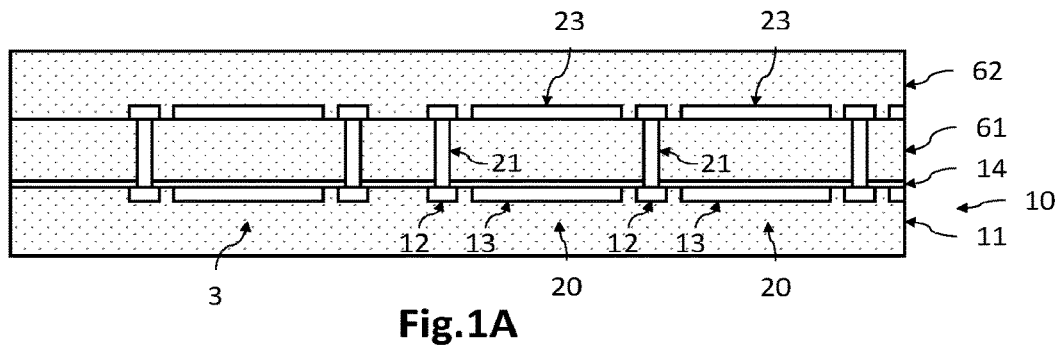
FIGS. 1A to 1I are schematic and partial views, in cross section, of various steps of a process for fabricating a detecting device according to a first embodiment.

In the figures and in the remainder of the description, the same references have been used to designate identical or similar elements. In addition, the various elements are not shown to scale for the sake of clarity of the figures. Moreover, the various embodiments and variants are not mutually exclusive and may be combined with one another. Unless indicated otherwise, the terms "substantially", "about" and "of the order of" mean to within 10%, and preferably to within 5%. Moreover, the terms "comprised between . . . and . . . " and equivalents mean that the bounds are included, unless indicated otherwise.

The invention relates in a general way to a process for fabricating a device for detecting electromagnetic radiation suitable for detecting infrared or terahertz radiation. This detecting device comprises, located in a hermetic cavity, one or more thermal detectors and at least one material that acts as a getter. The hermetic cavity is bounded by an encapsulating structure, which comprises a plurality of thin layers that are transparent to the electromagnetic radiation to be detected, and that notably include a thin encapsulating layer that extends continuously above the one or more thermal detectors, and, optionally, continuously above and around the latter. By thin layer, what is meant is a layer formed using the material deposition techniques used in microelectronics, and the thickness of which is preferably smaller than or equal to 10 µm. Moreover, a thin layer is said to be transparent when it has a transmittance higher than or equal to 50%, preferably to 75%, or even to 90% at a central wavelength of the spectral range of the electromagnetic radiation to be detected.

Generally, a material that acts as a getter is a material intended to be exposed to the atmosphere of the hermetic cavity and that is capable of pumping gas via absorption and/or adsorption. It is a metal that may be chosen from among titanium, zirconium, vanadium, chromium, cobalt, iron, manganese, palladium, barium and/or aluminium, or even an alloy of these metals such as TiZrV.

The fabricating process also comprises a step of producing the one or more thermal detectors by means of at least one sacrificial layer that is said to be mineral, this layer being made of a mineral or inorganic material. It is a silicon-based dielectric material that can also be used to form an inter-metal dielectric layer of the readout circuit, i.e. an electrically insulating material which, for example, has a dielectric constant, or relative permittivity, lower than or equal to 3.9, thus limiting the parasitic capacitance between the interconnects. This mineral material has no carbon chains, and may be a silicon oxide SiOx or a silicon nitride $Si_xN_y$, or an organosilicon material such as SiOC, SiOCH, or a material of the fluoride-glass type such as SiOF. The mineral sacrificial layer may be removed via a wet chemical etch, such as a chemical etch in an acid medium, for example hydrofluoric-acid vapour (HF vapour). By wet etch, what is generally meant is that the etchant is a liquid or vapour, and here preferably a vapour.

In addition, in so far as the one or more mineral sacrificial layers are removed after the thin encapsulating layer has been produced, the getter segment is protected by a protective segment made of amorphous carbon. The amorphous carbon may optionally be diamond-like carbon (DLC), i.e. amorphous carbon exhibiting a high fraction of $sp^3$ hybridization of the carbon. The protective segment is thus substantially inert with respect to the wet chemical etch carried out to remove the mineral sacrificial layer. By substantially inert, what is meant is that the amorphous carbon does not react substantially with the etchant used in the step of removing the mineral sacrificial layer, or even reacts little, and hence the protective segment, at the end of this removing step, still protects the getter material. The thin protective layer is suitable for being removed via a chemical etch such as a dry chemical etch, an etchant of which is for example oxygen contained in a plasma.

FIGS. 1A to 1I illustrate various steps of a process for fabricating a detecting device 1 according to one embodiment. For the sake of clarity, only one portion of the detecting device 1 has been shown in the figures. In this example, the thin encapsulating layer extends continuously above and around the thermal detectors. However, other configurations of the thin encapsulating layer are possible.

By way of example, the thermal detectors 20 are here suitable for detecting infrared radiation in the long wavelength infrared (LWIR), the wavelength of which is comprised between about 8 μm and 14 μm. Each detecting device 1 comprises one or more thermal detectors 20, and here a matrix array of identical thermal detectors, that are connected to a readout circuit located in the substrate 10 (which is thus called the readout substrate), and located in the same hermetic cavity 2. Thus the thermal detectors 20 form sensitive pixels that are periodically arranged, and that may have a lateral dimension in the plane of the readout substrate 10 of the order of a few tens of microns and for example equal to about 10 μm or less. As a variant, the detecting device 1 may comprise a plurality of hermetic cavities 2 each containing a single thermal detector 20.

Here, a three-dimensional direct coordinate system XYZ is defined in which the XY-plane is substantially parallel to the plane of the readout substrate 10, the Z-axis being oriented toward the thermal detectors 20 in a direction that is substantially orthogonal to the plane of the readout substrate 10; reference will be made to this coordinate system in the rest of the description. The terms "vertical" and "vertically" are to be understood to relate to an orientation substantially parallel to the Z-axis, and the terms "horizontal" and "horizontally" are to be understood to relate to an orientation substantially parallel to the plane (X,Y). Additionally, the terms "lower" and "upper" are to be understood to relate to a position of increasing distance from the readout substrate 10 in the +Z-direction.

With reference to FIG. 1A, at least one thermal detector 20 is, and here a plurality of thermal detectors 20 are, produced on the readout substrate 10, these thermal detectors 20 being covered by at least one mineral sacrificial layer 62. In this example, a plurality of compensating detectors 3 have also been produced.

The readout substrate 10 is silicon-based, and is formed of a carrier substrate 11 containing the readout circuit (not shown), which is suitable for controlling and reading the thermal detectors 20. The readout circuit here takes the form of a CMOS integrated circuit. It comprises, inter alia, segments of conductive lines that are separated from one another by inter-metal insulating layers made of a dielectric material, for example a silicon-based mineral material such as a silicon oxide ($SiO_x$), a silicon nitride ($SiN_x$), inter alia. Conducting segments 12 lie flush with the surface of the carrier substrate 11, and ensure the electrical connection of the anchoring pillars 21 of the thermal detectors 20 to the readout circuit. In addition, one or more connecting segments (not shown) lie flush with the surface of the carrier substrate, and allow the readout circuit to be connected to an external electronic device.

The readout substrate 10 may comprise a reflector 13 positioned facing each thermal detector 20. The reflector 13 may be formed by a segment of a conducting line of the last interconnect level, this line being made of a material suitable for reflecting the electromagnetic radiation to be detected. It lies facing the absorbent membrane 23 of the thermal detector 20, and is intended to form therewith a quarter-wave interference cavity for the electromagnetic radiation to be detected.

Lastly, the readout substrate 10 here comprises a protective layer 14 so as notably to cover the upper inter-metal insulating layer. This protective layer 14 here corresponds to an etch-stop layer made of a material that is substantially inert to the chemical etchant subsequently used to remove the various mineral sacrificial layers 61, 62, in HF vapour for example. This protective layer 14 thus forms a chemically inert, hermetic layer that is electrically insulating in order to prevent any short-circuiting between the anchoring pillars 21. It thus makes it possible to prevent the underlying inter-metal insulating layers from being etched during this step of removing the mineral sacrificial layers. It may be formed from an aluminium oxide or nitride, or even from aluminium trifluoride, or indeed from unintenionally doped amorphous silicon.

The thermal detectors 20 are then produced on the readout substrate 10. These production steps are identical or similar to those described, notably, in document EP3239670A1. The thermal detectors 20 are here microbolometers, each comprising an absorbent membrane 23, i.e. a membrane able to absorb the electromagnetic radiation to be detected, that is suspended above the readout substrate 10 by anchoring pillars 21, and thermally insulated from the substrate by holding and thermally insulating arms (not shown). Absorbent membranes 23 are conventionally obtained using surface micro-machining techniques consisting in producing the anchoring pillars 21 through a first mineral sacrificial layer 61, and producing the thermally insulating arms and the absorbent membranes 23 on the upper face of the mineral sacrificial layer 61. Each absorbent membrane 23 furthermore comprises a thermometric transducer, for example a thermistor material, connected to the readout circuit by electrical connections provided in the thermally insulating arms and in the anchoring pillars 21. In this example, the detecting device 1 comprises optically active thermal detectors 20, i.e. detectors intended to detect the electromagnetic radiation of interest. It also comprises one or more detectors referred to as compensating detectors 3, i.e. detectors intended to not receive the electromagnetic radiation of interest. The compensating detector 3 is intended to measure a common-mode electrical signal, this electrical signal being to be subtracted from the electrical signal measured by the optically active thermal detectors 20.

Next, a second mineral sacrificial layer 62 preferably of same nature as the first mineral sacrificial layer 61 is deposited. The second mineral sacrificial layer 62 covers the mineral sacrificial layer 61, the thermal detectors 20 and the compensating detectors 3. It has a substantially planar upper face opposite the readout substrate 10 along the Z-axis. Generally, the various mineral sacrificial layers 61, 62 may be a silicon oxide obtained using a tetraethyl-orthosilicate (TEOS) compound and deposited by PECVD.

Figure 1B:
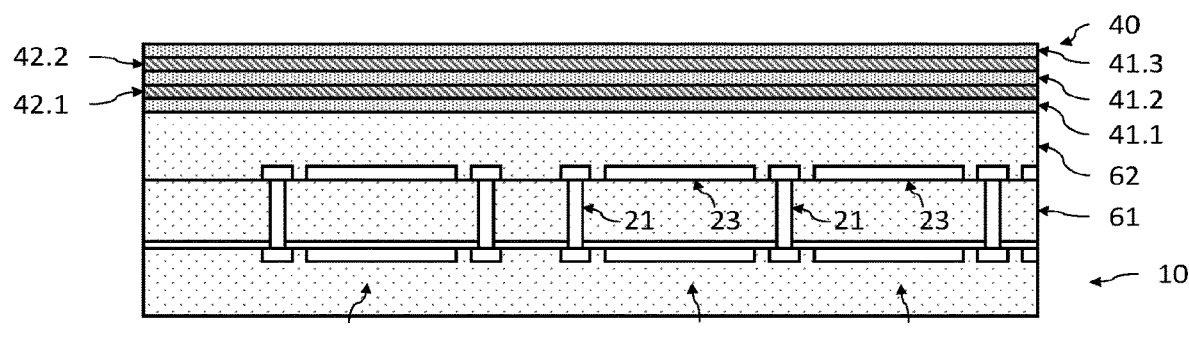

With reference to FIG. 1B, a stack 40 referred to as the getter stack is then deposited, this stack being intended to be used to produce one or more pads 50 that are referred to as getter pads and that are described in detail below. This stack 40 is referred to as the getter stack in so far as it comprises at least one thin getter layer 42 and at least one thin protective layer 41 made of amorphous carbon. It is produced so as to cover the upper face of the mineral sacrificial layer 62, and here lies facing the optically active thermal detectors 20 and the compensating detectors 3. The getter stack 40 is formed of a stack, along the Z-axis, of a plurality of thin planar layers 41, 42 that are parallel to one another, these layers including at least a lower protective layer 41.1 lying on and making contact with the mineral sacrificial layer 62, and a getter layer 42.1 lying on and making contact with the lower protective layer 41.1. The thin layers 41, 42 of the getter stack 40 are said to be planar in so far as they extend in a planar manner in the XY-plane over their entire areal extent.

In this example, the getter stack 40 comprises a plurality of getter layers 42.1, 42.2, here two layers, each getter layer 42 being intermediate between and making contact with two protective layers 41. The number of getter layers 42 is chosen depending on the desired active surface area of getter material in the hermetic cavity 2. The fact that a protective layer 41.3 covers the upper getter layer 42.2 is useful when a vent 33 is present through the thin encapsulating layer 31 and opens onto the getter pad 50 (see FIG. 1E). The underlying getter segment 52.2 is then protected from the wet etchant employed in the step of removing the mineral sacrificial layers 61, 62. The protective layers 41 are made of amorphous carbon, and may have a thickness comprised between 50 nm and 500 nm. The getter layers 42 may for example be made of titanium, and may have a thickness comprised between about 100 nm and 1 µm, and typically of 300 nm.

Figure 1C:
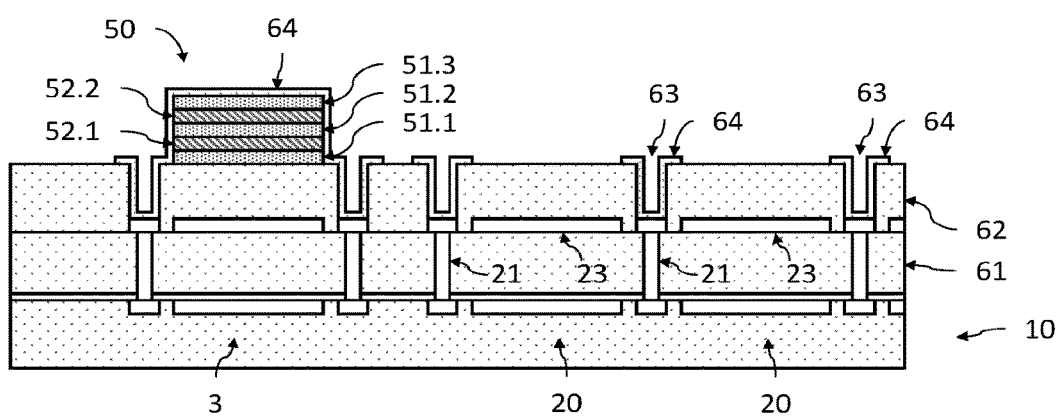

With reference to FIG. 1C, a plurality of so-called getter pads 50 are produced by lithography and localized etching of the getter stack 40. The etching is carried out so as to locally etch the getter stack 40 right through its thickness, so as to reach the mineral sacrificial layer 62. When a plurality of getter pads 50 are produced, they are then separate and away from one another in the XY-plane. Thus, the one or more getter pads 50 partially cover the mineral sacrificial layer 62. In addition, they are formed from a stack of segments 51, 52 of said thin planar layers 41, 42, and therefore each comprise a lower protective segment 51.1 made of amorphous carbon resting on and making contact with the mineral sacrificial layer 62, and a getter segment 52.1 resting on and making contact with the lower protective segment 51.1.

The getter pads 50 are placed away, in the XY-plane, from the optically active thermal detectors 20 so as not to disrupt the transmission of the electromagnetic radiation to be detected. They are thus located at a nonzero distance, in the XY-plane, from the absorbing membranes 23 of these thermal detectors 20, and advantageously at a non-zero distance from the thermally insulating arms and from the anchoring pillars 21 of the latter. In this example, they are placed facing, i.e. plumb with along the Z-axis, compensating detectors 3 so as to shield them from the incident electromagnetic radiation.

In this figure, a single compensating detector 3 and a single getter pad 50 have been shown, although a plurality of compensating detectors 3 and a plurality of getter pads 50 may be present. The one or more getter pads 50 may have a dimension, in the XY-plane, of the order of a few microns to a few tens of microns, and preferably smaller than or equal to 50 µm so as to ensure a good mechanical attachment. The one or more getter pads 50 may have a variable number and arrangement in the XY-plane. Thus, by way of example, a given getter pad 50 may lie facing a plurality of compensating detectors 3. In this case, apertures (not shown here) may be produced locally in this getter pad 50 in order to allow pillars of large size for supporting the thin encapsulating layer 31 to be produced. It may comprise a plurality of apertures (described below) in order to allow access, where appropriate, to the intermediate protective segments 51. As a variant, a plurality of getter pads 50 may be produced, these pads being arranged in such a way that there is one getter pad 50 per compensating detector 3. Other arrangements are of course possible.

Advantageously, one or more grooves 63 are then produced in order to allow supporting pillars 31.3 to be produced. These are particularly useful when the hermetic cavity 2 comprises a high number of thermal detectors 20. These grooves 63 extend from the upper face of the mineral sacrificial layer 62 along the Z-axis in order to open onto at least one portion of the anchoring pillars 21 of the thermal detectors 20 and/or of the compensating detectors 3. A thin insulating layer 64, made of an electrically insulating material, is then deposited on the freed surface of the anchoring pillars 21 inside the grooves 63. This thin insulating layer 64 makes it possible to avoid an electrical short-circuit between the detectors 3, 20 via the thin encapsulating layer 31 and its supporting pillars 31.3. The thin insulating layer 64 is preferably etched locally facing the thermal detectors 20, so as not to decrease the transmission of the electromagnetic radiation to be detected. It may have a thickness comprised between about 10 nm and 100 nm. It is made of a material that is inert to the wet chemical etch employed to remove the mineral sacrificial layers 61, 62, which may be chosen from AlN, $Al_2O_3$ and $HfO_2$.

Figure 1D:
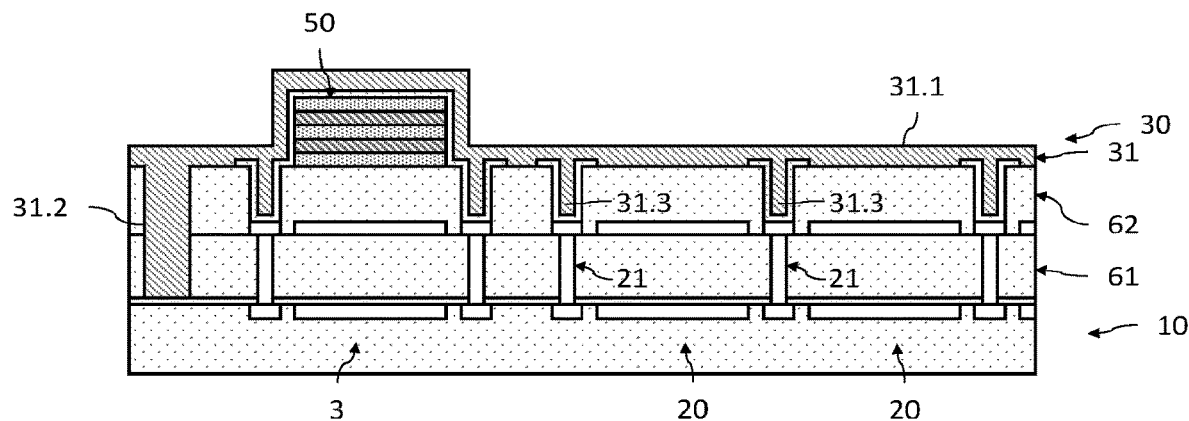

With reference to FIG. 1D, the thin encapsulating layer 31 of an encapsulating structure 30 is then produced in a similar way to that described in document EP3239670A1, for each matrix array of thermal detectors 20. Firstly, using conventional photolithography techniques, the mineral sacrificial layers 61, 62 are etched locally to form trenches that open onto the readout substrate 10. The trenches (or continuous trench) together form a continuous and closed perimeter encircling, in the XY-plane, the thermal detectors 20 and the compensating detectors 3.

Next, the thin encapsulating layer 31, which here is made of amorphous silicon of a thickness of about 800 nm (but other materials, such as Ge or SiGe, may be used), is deposited using a conformal deposition technique (for example chemical vapour deposition (CVD)), this thin encapsulating layer extending over the mineral sacrificial layer 62 and into the trenches and here the grooves 63. The thin encapsulating layer 31 therefore comprises an upper portion 31.1 (also called the upper wall) that extends above, at a distance along the Z-axis, the thermal detectors 20 and covers the mineral sacrificial layer 62 and the getter pad 50. It also comprises a peripheral portion 31.2 (also called the peripheral wall) that continuously encircles, in the XY-plane, the thermal detectors 20 and that makes contact with the sidewalls of the mineral sacrificial layers 61, 62. It also here comprises supporting pillars 31.3 that extend, along the Z-axis, from the upper wall 31.1 to the anchoring pillars 21. The upper wall 31.1, the peripheral wall 31.2 and the supporting pillars 31.3 are integrally formed. Thus, the upper wall 31.1 of the thin encapsulating layer 31 extends over the upper face of the mineral sacrificial layer 62, and over the sidewalls and over the upper face of the one or more getter pads 50. The sidewalls are the surfaces of a layer or a layer segment that extend along an axis substantially orthogonal to the substrate and that define a border, in the XY-plane, of the layer or layer segment.

Figure 1E:
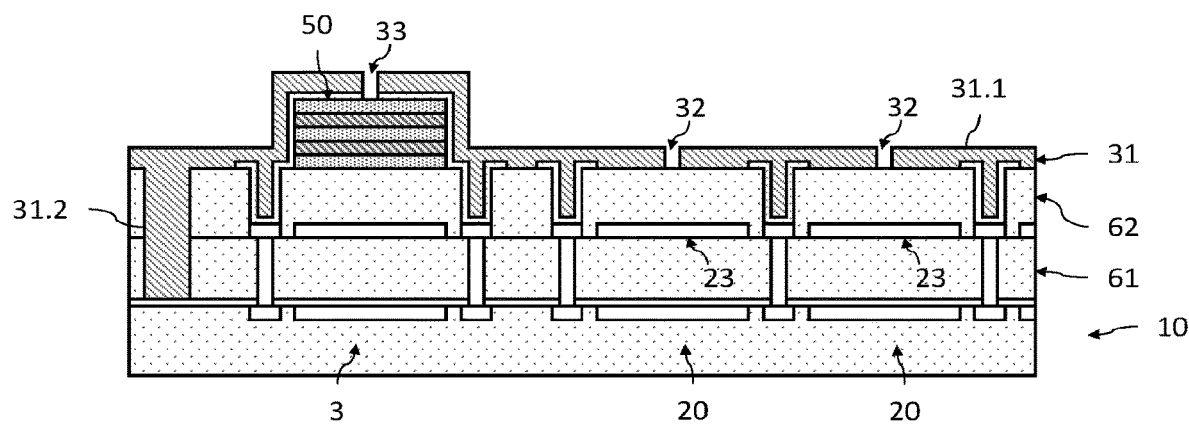

With reference to FIG. 1E, the first vents 32 are produced through the thin encapsulating layer 31 so as to open onto the mineral sacrificial layer 62 and are intended to allow the various mineral sacrificial layers 61, 62 to be removed from the cavity 2. They are placed away from the getter pads 50. In this example, the vents 32 are located plumb with the absorbent membranes 23 of the thermal detectors 20, but they may be placed elsewhere. Preferably, at the same time, second vents 33 are produced through the thin encapsulating layer 31 and here the thin insulating layer, and here open onto the upper protective segment 51.3 of the getter pads 50.

Figure 1F:
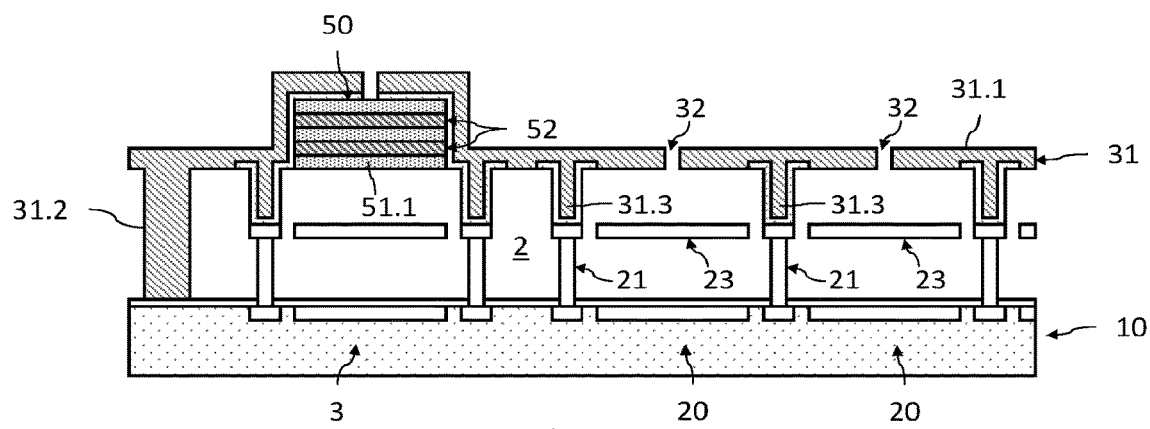

With reference to FIG. 1F, a first chemical etch suitable for removing the mineral sacrificial layers 61, 62 is carried out, here via a wet chemical etch in hydrofluoric-acid vapour. The products of the chemical reaction are removed through the first vents 32. Since this wet chemical etch is isotropic, suspension of the absorbent membranes 23 is obtained, and the anchoring pillars 21, the thermally insulating arms and the supporting pillars 31.3 are freed. The first chemical etch is selective and hence the lower protective segment 51.1 of the getter pad 50 is not removed, the getter segments 52 thus being entirely protected from the HF-vapour etch. Thus, the lower surface of the protective segment 51.1 is freed, i.e. the surface thereof initially in contact with the mineral sacrificial layer 62 is now free. The upper wall 31.1 of the thin encapsulating layer 31 therefore rests on the readout substrate 10 via the peripheral wall 31.2 and here via the supporting pillars 31.3, which bear against the anchoring pillars 21.

Figure 1G:
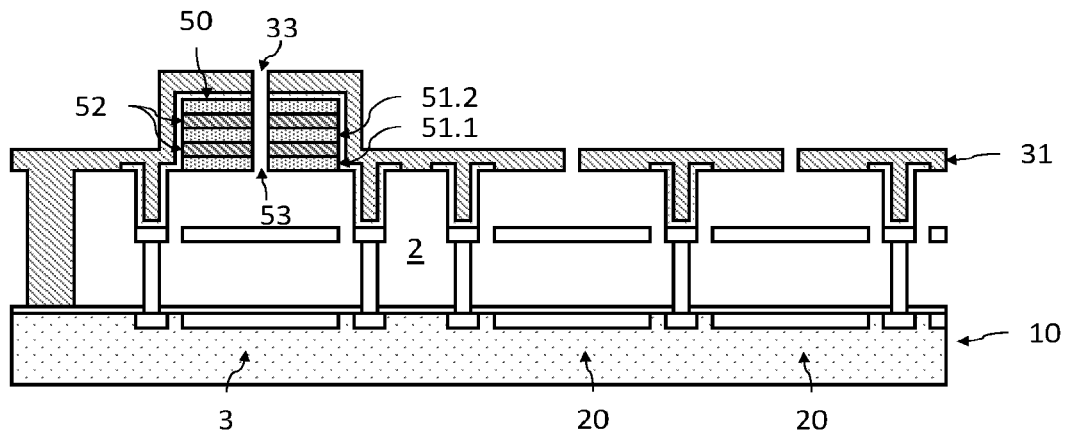

With reference to FIG. 1G, the depth of the second vent 33 is extended to form at least one aperture 53, this aperture being self-aligned on the second vent 33 and extending through the getter pads 50 in the direction of the readout substrate 10, so as to allow the etchant of the second chemical etch to access all the protective segments 51, and here in particular the intermediate protective segment 51.2. In this example, the aperture 53 is a through-aperture in so far as it passes through the various protective segments 51 and the various getter segments 52. It may however not be a through-aperture and extend only partway through the lower protective segment 51.1 (see FIG. 4A). This step may be carried out using conventional dry etchants that offer a good selectivity with respect to the material of the thin encapsulating layer 31 (here amorphous Si), for example chlorine-containing etchants ($Cl_2$, $BCl_3$, etc.).

Figure 1H:
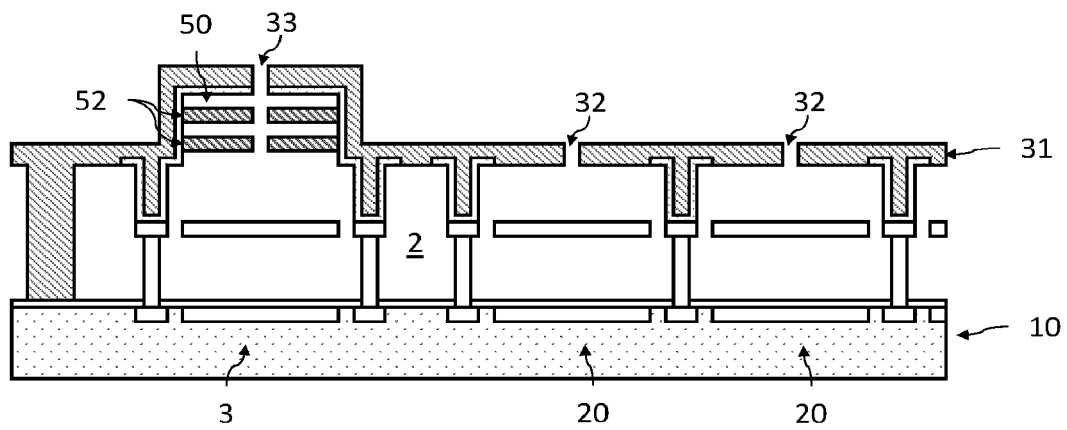

With reference to FIG. 1H, a second chemical etch suitable for removing the protective segments 51 made of amorphous carbon, and therefore for freeing the surfaces of the getter segments 52, is carried out. The chemical etch is here a dry chemical etch the etchant of which is for example oxygen present in a plasma. Since this dry chemical etch is isotropic, the integrity of the freed structures is preserved while facilitating the access of the etchant to the cavity 2 through the first and second vents 32, 33. Thus, the getter segments 52 are freed, i.e. they have a free (uncoated) surface, and are therefore exposed to the atmosphere of the cavity 2. They are held suspended above the readout substrate 10 on an external flank by the thin encapsulating layer 31. Here, the getter segments 52 each have free lower and upper surfaces, thus increasing the total active surface area of the getter material inside the cavity 2.

Figure 1I:
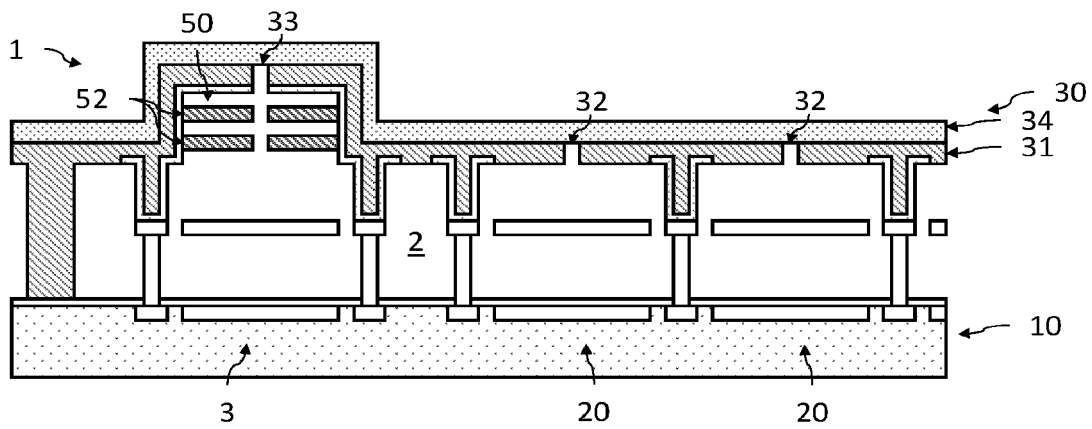

With reference to FIG. 1I, a sealing layer 34 is deposited on the thin encapsulating layer 31 with a sufficient thickness to ensure the various vents 32, 33 are sealed, i.e. plugged. The sealing layer 34 is transparent to the electromagnetic radiation to be detected, and may be made of germanium with a thickness of about 1.7 µm. It is also possible to deposit an antireflection layer (not shown) allowing the transmission of the electromagnetic radiation through the encapsulating structure to be optimized. This antireflection layer may be made of zinc sulfide with a thickness of about 1.2 µm. A hermetic cavity 2 under vacuum or at low pressure and in which the thermal detectors 20 and the getter segments 52 are housed is obtained, the latter being suspended above the readout substrate 10 and held by the thin encapsulating layer 31.

Thus, the fabricating process according to the invention allows the protection of the getter segment 52 from the wet etch employed in the step of removing the mineral sacrificial layers 61, 62 to be improved. Specifically, in the configuration of the aforementioned document EP3239670A1, in which the mineral sacrificial layer 61 is a silicon oxide deposited on the protective layer, the inventors have observed a potential degradation of this protective layer when it is made of amorphous carbon and the silicon oxide is notably obtained using a tetraethyl-orthosilicate (TEOS) compound, this degradation possibly leading to a deterioration of the getter segment 52. In contrast, here, the protective segment 51 made of amorphous carbon is deposited after the production of the mineral sacrificial layers 61, 62, and hence it is preserved from any degradation related to the step of producing these mineral sacrificial layers 61, 62.

In addition, the protection of the getter segment 52 from the wet etch is also improved in so far as potential defects in the coverage of the getter segments 52 by the protective segments 51 are avoided. Specifically, in the configuration of document EP3239670A1, in which the protective layer is deposited on the getter segment 52, the inventors have observed a possible defect in the coverage of the flanks of the getter segment 52 when the protective layer is made of amorphous carbon. In contrast, here, the protective segments 51 are planar and cover only the lower and or upper faces of the getter segments 52 and not the flanks thereof, and hence the risk of coverage defects is decreased or even avoided.

Moreover, document EP2141117A1 describes a configuration of a thermal detector encapsulated in a hermetic cavity. A getter segment is produced on a sacrificial layer and is protected by an intermediate protective layer. The issues related to the use of a protective material made of amorphous carbon and of a mineral sacrificial material are not mentioned. In addition, this document describes a protective layer that covers the upper face, but also the flanks of the sacrificial layer, and that extends down to the substrate on the border of the sacrificial layer. This configuration leads to the obtainment of an encapsulating structure with a larger footprint, whereas the fabricating process according to the mention allows the small footprint described in document EP3239670A1 to be preserved. In any case, the getter segment in document EP3239670A1 was structured in such a way as to cover the protective layer only partially. In contrast, in the process according to the invention, the protective layer 41 and the getter layer 42 are structured together to form the getter pad 50. The getter segment 52 therefore completely covers the upper face of the protective segment 51.

In addition, the protective layer described in document EP2141117A1 is not continuously planar over its entire areal extent, and hence coverage defects could arise if it were made of amorphous carbon, thus leading to a possible degradation of the getter segment, in particular when it is located in proximity to the vertical portion of the protective layer. This situation is avoided in the fabricating process according to the invention.

FIGS. 2A to 2D illustrate various steps of a process for fabricating a detecting device 1 according to one variant embodiment. This variant differs from the process described above essentially in that a lateral over-etch of the protective segments 51 of the one or more getter pads 50 is carried out. Only certain steps are detailed here, the others being identical or similar to those described above.

Figure 2A:
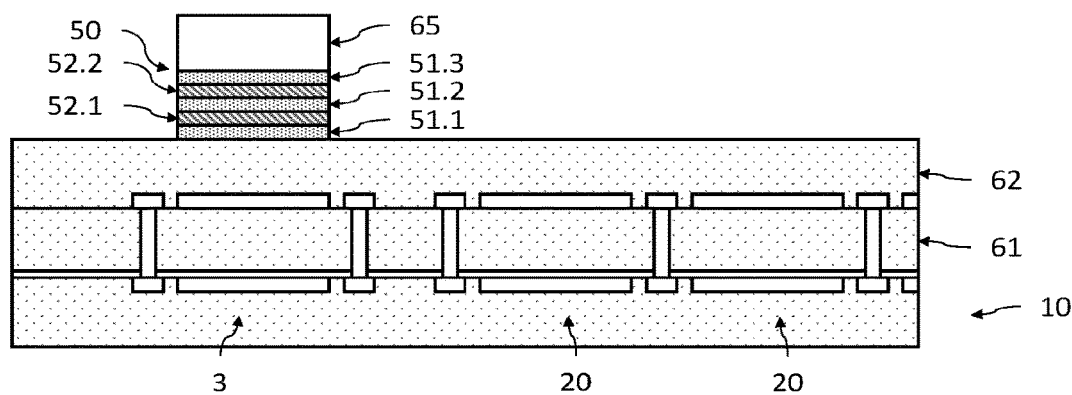
FIGS. 2A to 2D are schematic and partial views, in cross section, of various steps of a process for fabricating a detecting device according to one variant embodiment, in which a lateral over-etch is carried out on certain of the segments of layers forming the getter pad.

With reference to FIG. 2A, one or more getter pads 50 are produced on the mineral sacrificial layer 62, these getter pads being located away from the optically active thermal detectors 20 in the XY-plane, and here being placed facing the compensating detectors 3. A mask 65 covers solely the upper face of the getter pad 50 and not the flanks of the latter. The dimensions, in the XY-plane, of the protective segments 51 and of the getter segments 52 are substantially identical, and hence the getter pad 50 has flanks that are substantially vertical (to within manufacturing tolerances).

Figure 2B:
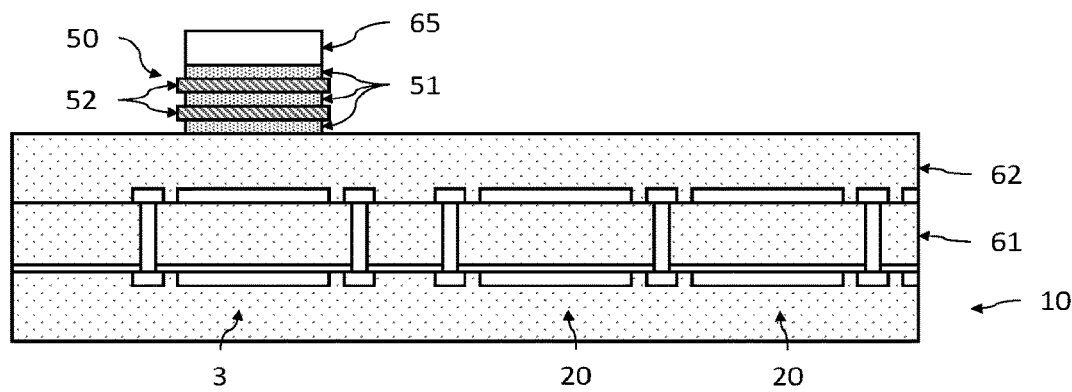

With reference to FIG. 2B, an isotropic dry etch, for example in oxygen plasma, is carried out so as to cause a slight lateral over-etch of the flanks of the protective segments 51, and not of the flanks of the getter segments 52. Thus, the protective segments 51 have, in the XY-plane, smaller dimensions than those of the getter segments 52. Advantage will be taken of this two-dimensional topology (along the Z-axis) of the flanks of the getter pad 50 to improve the mechanical attachment of the getter segments 52 when they are suspended following the step of dry chemical etching.

Figure 2C:
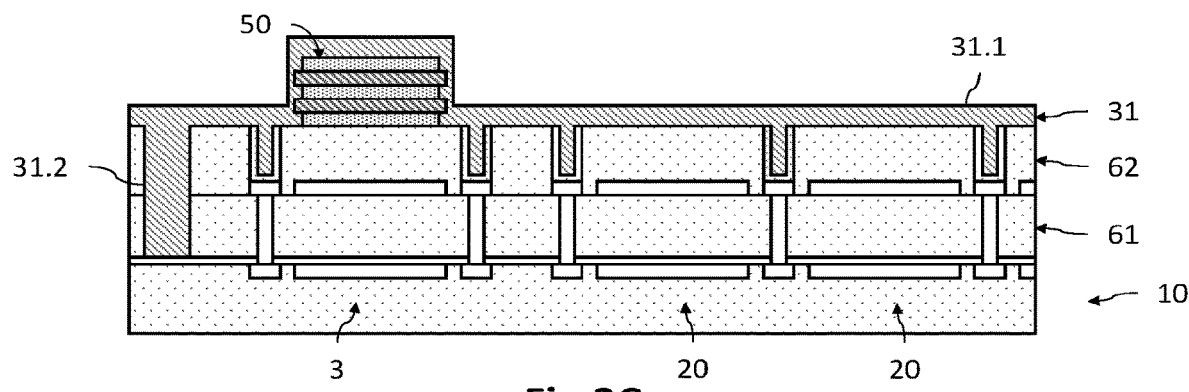

With reference to FIG. 2C, the thin encapsulating layer 31 is produced. In this example, the thin insulating layer is not been shown on the flanks of the getter pad 50, for the sake of clarity. It may be present and not extend over the getter pad 50. Thus, the upper wall 31.1 of the thin encapsulating layer 31 extends so as to cover the flanks of two-dimensional topology of the getter pad 50, and hence the area of mechanical attachment is larger than in the example of FIGS. 1A to 1I.

Figure 2D:
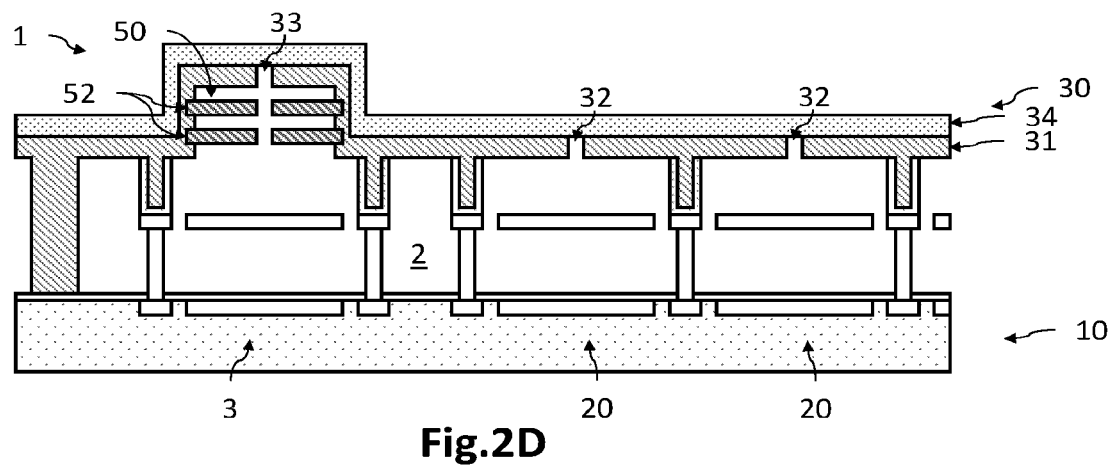

With reference to FIG. 2D, after the various vents 32, 33 and apertures 53 have been produced, and the mineral sacrificial layers 61, 62 have been removed by wet etching and the protective segments 51 have been removed by dry etching, the thin sealing layer 34 is deposited. The encapsulating structure 30 thus obtained essentially differs here from that described with reference to FIG. 1I in that the thin encapsulating layer 31 here covers an external border of the lower and upper faces of the getter segments 52, because of the initial two-dimensional topology of the flanks of the getter pad 50. Thus, the mechanical attachment of the getter segments 52 thus suspended is improved.

Figure 3:
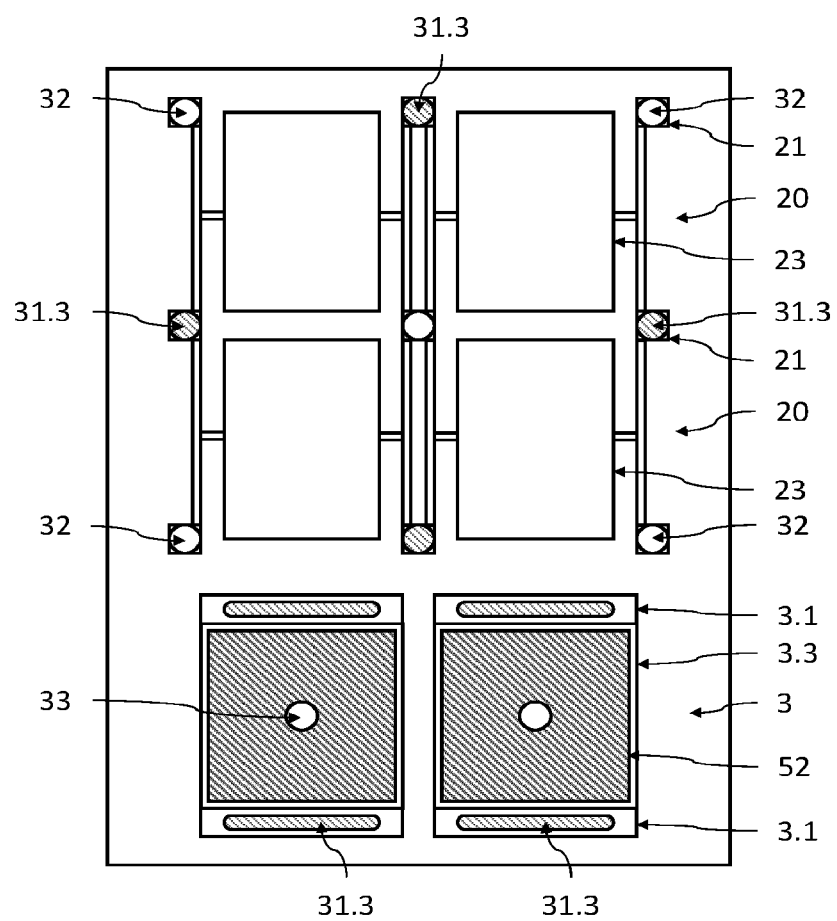
FIG. 3 is a view from above of a detecting device according to one embodiment, illustrating thermal detectors and compensating detectors, and one arrangement of the getter segments.

FIG. 3 is a schematic and partial view from above of an example of an arrangement of the thermal detectors 20, of the compensating detectives 3 and of the getter segments 52.

The thermal detectors 20 each comprise an absorbent membrane 23 suspended above the readout substrate 10 by anchoring pillars 21 and holding and thermally insulating arms 22. Supporting pillars 31.3 are here arranged so as to rest on some of the anchoring pillars 21. Here, one anchoring pillar 21 in two, along the X-axis and along the Y-axis, receives a supporting pillar 31.3. The first vents 32 are here placed facing other anchoring pillars 31.3. Other arrangements of the first vents 32 are of course possible.

The compensating detectors 3 each comprise a membrane 3.3 that is substantially identical to the absorbent membranes 23, but that is intended to not receive the electromagnetic radiation to be detected. These membranes 3.3 are suspended above the readout substrate 10 by anchoring pillars 3.1. In this configuration, the membranes 3.3 are not thermally insulated from the readout substrate 10 by holding arms. Supporting pillars 31.3 are here arranged so as to rest on the anchoring pillars 3.1. The getter segments 52 are here located facing the membranes 3.3, and have dimensions chosen so as to shield the membranes from the electromagnetic radiation. The vents 33 are here located at the centre of the getter segments 52.

Thus, the surface area of the one or more getter segments 52 may be large, while limiting the footprint and the size of the encapsulating structure. Superposing a plurality of getter segments 52 on top of one another allows the active surface area of the getter material to be increased without having to increase the size of the hermetic cavity 2.

Figure 4A:
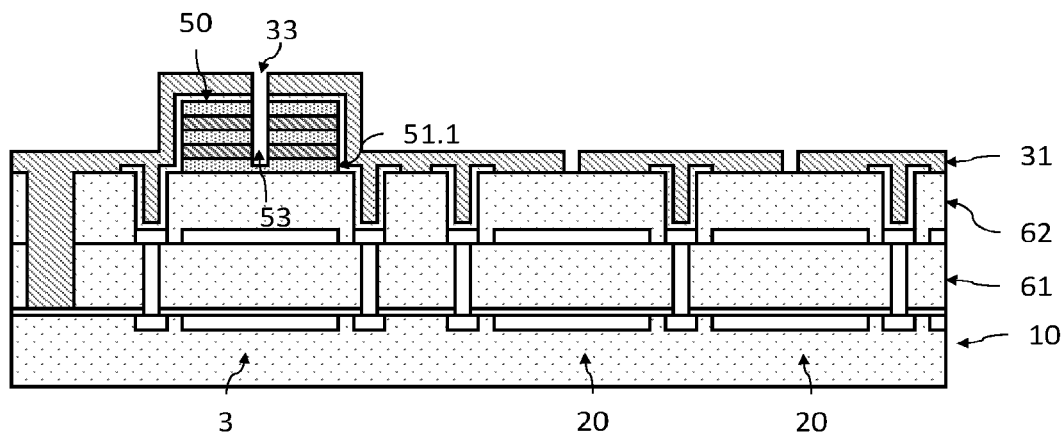
FIGS. 4A to 4C are schematic and partial views, in cross section, of various steps of a process for fabricating a detecting device according to another variant embodiment, in which a specific sealing layer covers the getter pad.
Figure 4B:
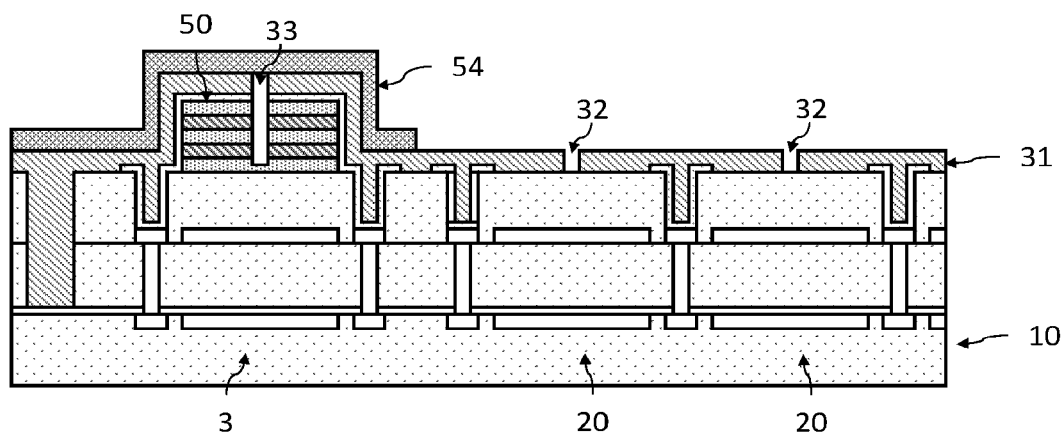
Figure 4C:
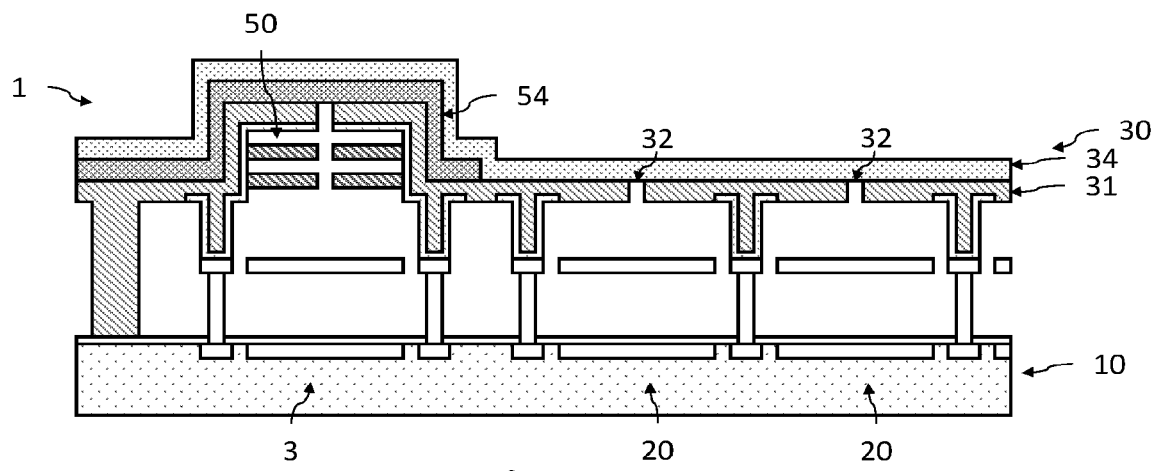

FIGS. 4A to 4C illustrate various steps of a process for fabricating a detecting device 1 according to another variant embodiment. This variant differs from the process described above with reference to FIGS. 1A to 1I essentially in that a second thin sealing layer 54 is used to block the second vent 33. Only certain steps are detailed here, the others being identical or similar to those described above.

With reference to FIG. 4A, a structure that on the whole is similar to that described with reference to FIG. 1E is produced. However, instead of proceeding to remove the mineral sacrificial layers 61, 62, the self-aligned aperture 53 extending through the getter pad 50 is produced from the second vent 33. In this example, the aperture 53 is not a through-aperture, but opens onto the lower protective segment 51.1.

With reference to FIG. 4B, a thin sealing layer 54 is deposited on the thin encapsulating layer 31 so as to block the second vent 33. This sealing layer 54 is preferably etched locally so as to retain only a portion covering the getter pad 50 and so as to remove the portion located facing the thermal detectors 20, in particular when it is made of a material that is not transparent to the electromagnetic radiation to be detected. The vents 32 are therefore not blocked by the thin sealing layer 54.

With reference to FIG. 4C, after the mineral sacrificial layers 61, 62 have been removed by wet etching and the protective segments 51 have been removed by dry etching, the thin sealing layer 34 is deposited so as to block the vents 32. The encapsulating structure 30 thus obtained essentially differs here from that described with reference to FIG. 1I in that it comprises a second thin sealing layer 54 that covers the initial getter pad 50, that is distinct from the thin sealing layer 34, and that preferably does not lie facing the thermal detectors 20.

Figure 5A:
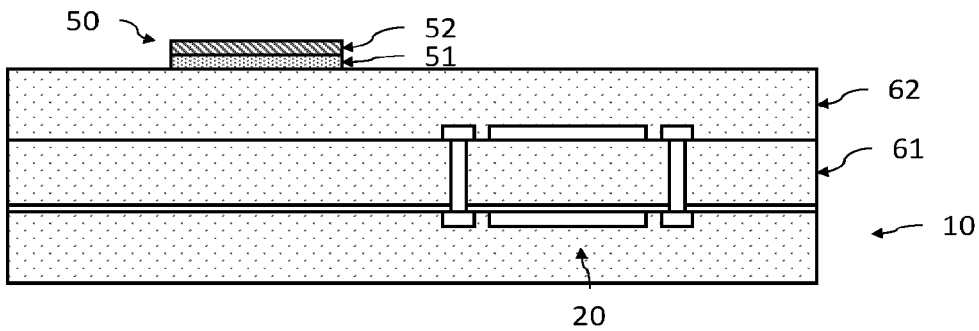
FIGS. 5A to 5C are schematic and partial views, in cross section, of various steps of a process for fabricating a detecting device according to another variant embodiment.
Figure 5B:
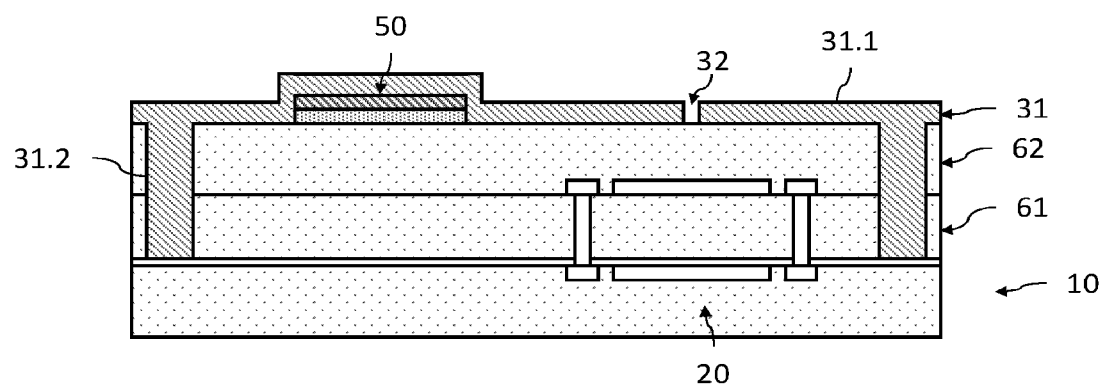
Figure 5C:
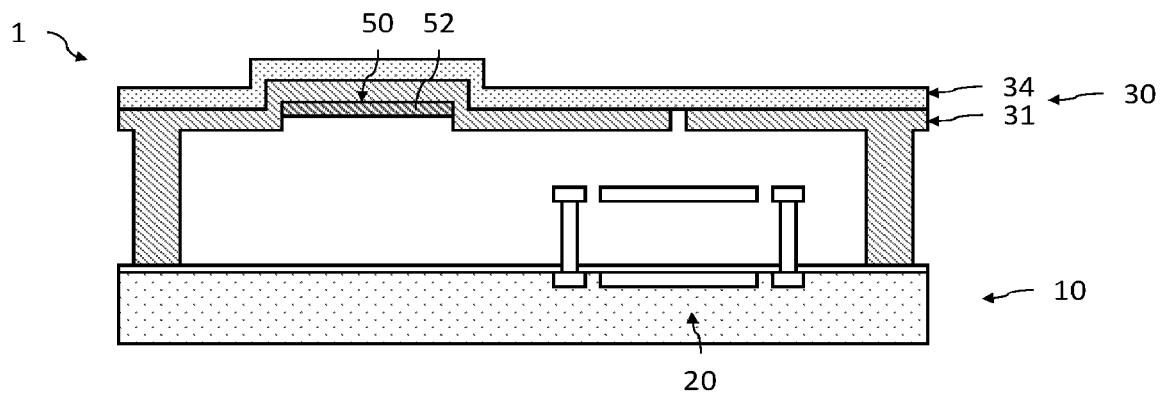

FIGS. 5A to 5C illustrate various steps of a process for fabricating a detecting device 1 according to another variant embodiment. This variant differs from the process described above with reference to FIGS. 1A to 1I essentially in that the detecting device 1 does not comprise any compensating detectors 3 (though it could comprise some), and in that the getter pad 50 comprises a single protective segment 51 made of amorphous carbon and a single getter segment 52. Only certain steps are detailed here, the others being identical or similar to those described above.

With reference to FIG. 5A, a getter pad 50 is produced, from the getter stack 40, so that it is located away, in the XY-plane, from the optically active thermal detectors 20 and rests solely on the upper face of the mineral sacrificial layer 62. It comprises a protective segment 51 made of amorphous carbon that rests on and makes contact with the planar upper face of the mineral sacrificial layer 62. A getter segment 52 solely covers the upper face of the protective segment 51, and therefore does not make contact with the flanks thereof or contact with the mineral sacrificial layer 62.

With reference to FIG. 5B, the thin encapsulating layer 31 is produced so that the upper wall 31.1 covers the upper face of the mineral sacrificial layer 62 and the getter pad 50, and that the peripheral wall 31.2 extends into the trenches and makes contact with the mineral sacrificial layers 61, 62. A vent 32 is produced through the thin encapsulating layer 31 so that it opens onto the mineral sacrificial layer 62. It is located away from the getter pad 50.

With reference to FIG. 5C, the mineral sacrificial layers 61, 62 are removed via a wet etch, here in HF vapour. The protective segment 51 has a freed lower surface, but the getter segment 52 remains protected during this step. Next, the protective segment 51 made of amorphous carbon is removed via a dry etch, here in oxygen plasma, so as to free a lower surface of the getter segment 52. The thin sealing layer 34 and the antireflection layer are then deposited.

Figure 6A:
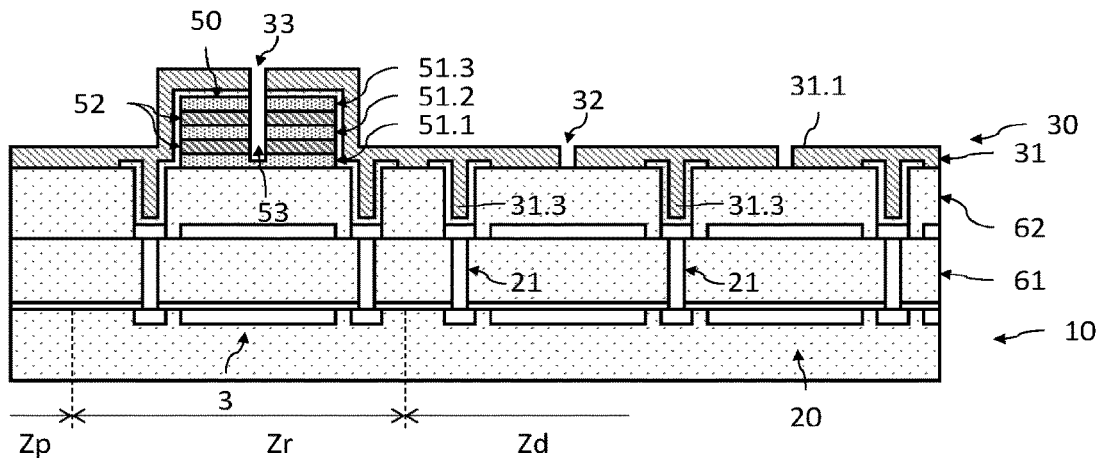
FIGS. 6A to 6C are schematic and partial views, in cross section, of various steps of a process for fabricating a detecting device according to another variant embodiment, in which the encapsulating structure comprises a peripheral wall made of a mineral material.
Figure 6B:
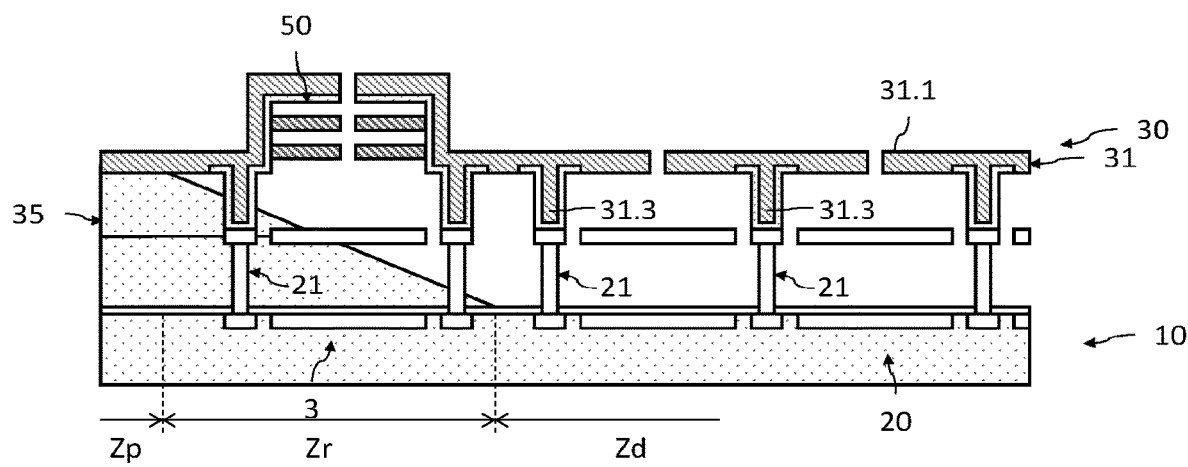
Figure 6C:
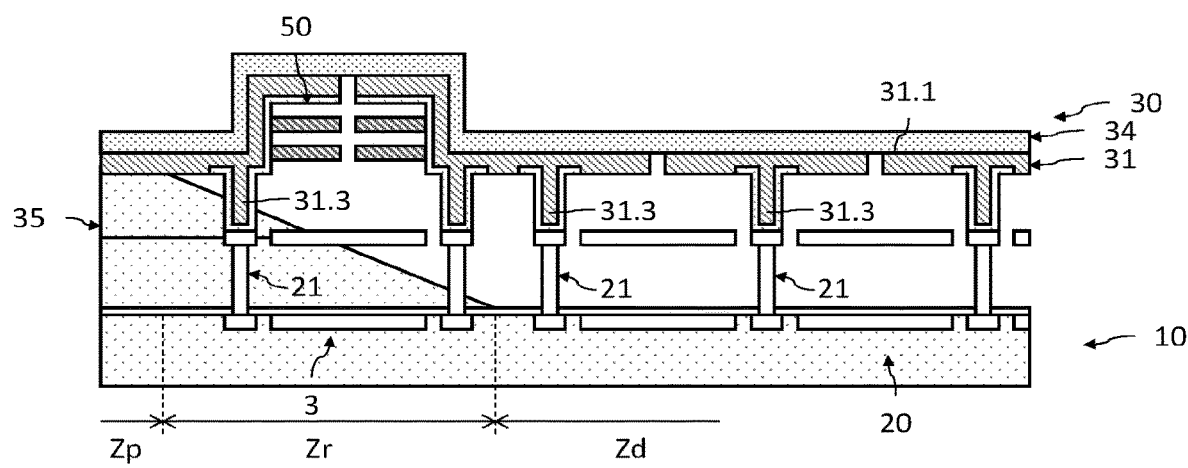

FIGS. 6A to 6C illustrate various steps of a process for fabricating a detecting device 1 according to another variant embodiment. This variant differs from those described above essentially in that the encapsulating structure comprises a peripheral wall made of a mineral material. This variant embodiment is notably described in French patent application FR2003858 (filed May 16, 2020) which is incorporated here by reference.

More precisely, as illustrated in FIG. 6C, the peripheral wall 35, which continuously encircles the thermal detectors 20 and here the compensating detectors 3 and thus bounds the cavity 2 laterally, is no longer integrally formed with and made of the same material as the upper wall 31.1 of the encapsulating layer 31. In other words, it is not a portion of the encapsulating layer 31. It is made of a different material, here of a mineral material, in so far as it consists of unetched segments of the mineral sacrificial layers 61 and 62.

FIG. 6A illustrates a step similar to that described with reference to FIG. 4A. It differs therefrom in that the encapsulating layer 31 does not comprise a peripheral wall that extends through the sacrificial layers 61 and 62 in order to make contact with the substrate 10. In contrast, it comprises only the upper wall 31.1, and the supporting pillars 31.3. The vents 32, which are placed solely in a central region Zd, and the vent 33 that forms the aperture 53 are produced. The aperture 53 is not a through-aperture but opens onto the lower protective segment 51.1.

Specifically, the surface of the substrate 10 is divided into a plurality of regions:
a central region Zd, which is referred to as the detecting region, in which the matrix array of (sensitive) thermal detectors 20, i.e. the detecting pixels, is located. The surface of the readout substrate 10 in the detecting region Zd is intended to be entirely freed from the mineral sacrificial layers 61, 62, in order to not be covered by the peripheral wall 35;
an intermediate region Zr, which is referred to as the reinforcing region, that continuously encircles the detecting region Zd in the XY-plane, and in which the dummy detectors 3 may be found. It is intended to be covered by the peripheral wall 35;
a peripheral region Zp that continuously encircles the reinforcing region Zr in the XY-plane, and in which the upper wall 31.1 of the thin encapsulating layer 31 is intended to extend over and make contact with the peripheral wall 35.

With reference to FIG. 6B, a chemical etch suitable for partially removing, via the vents 32, the mineral sacrificial layers 61, 62, is carried out. The chemical etch is a wet etch in an acid medium, hydrofluoric-acid vapour for example. The products of the chemical reaction are removed through the vents 32.

Because the vents 32 are placed solely facing the detecting region Zd, the etchant entirely removes the mineral sacrificial layers 61, 62 located in the detecting region Zd, but the chemical etch is carried out so that the etchant does not etch a peripheral segment of the mineral sacrificial layers 61, 62 that lies around the detecting region Zd. The unetched segment of the mineral sacrificial layers 61, 62, on which segment the upper segment 31.1 of the thin encapsulating layer 31 rests, defines the peripheral region Zp. It forms the peripheral wall 35.

The peripheral wall 35 comprises a lateral recess, and hence the cavity 2 widens vertically, i.e. it has a shape that is flared in the +Z-direction. The dimensions of the cavity 2 in the XY-plane are larger next to the upper segment 31.1 than next to the freed surface of the readout substrate 10. This etch profile of the mineral sacrificial layers 61, 62 is obtained when the sacrificial layers are made of a mineral material and the etch is a chemical etch in an acid medium in a confined space.

Next, the protective segments 51 that flank the getter segments 52 are removed by dry etching as described above.

With reference to FIG. 6C, the sealing layer 34 that will block the vents 32 and 33 is then deposited. Reinforcing pillars 31.3 may thus be present in the intermediate region Zr and rest on the substrate 10. In this example, they rest indirectly on the substrate 10, here via the pillars 21 of the dummy detectors 3. As a variant, they may rest directly on the substrate 10, by passing vertically through the peripheral wall 35 to make contact with the substrate 10. In any case, the presence of the reinforcing pillars 31.3 in the intermediate region Zr allows the mechanical strength of the encapsulating structure 30 to be improved, in so far as they may make contact with and pass at least partially through the peripheral wall 35, this ensuring a better transmission of mechanical stresses between the encapsulating structure 30 and the substrate 10.

In this variant embodiment, the mechanical strength of the encapsulating structure 30 on the substrate 10 is improved, in so far as the contact with the substrate 10 is ensured via a peripheral wall 35 of larger lateral dimension than the peripheral wall 31.2. Thus, the risk of the bonding of the encapsulating structure 30 from the substrate 10 is limited.

Figure 7A:
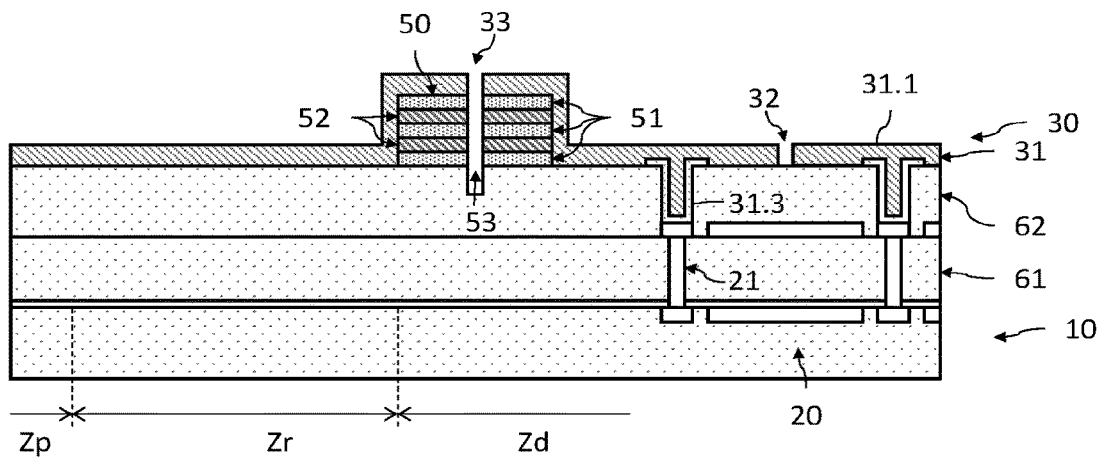
FIGS. 7A to 7C are schematic and partial views, in cross section, of various steps of a process for fabricating a detecting device according to another variant embodiment, in which the encapsulating structure comprises a peripheral wall made of a mineral material, and in which the mineral sacrificial material is removed through first and second vents.
Figure 7B:
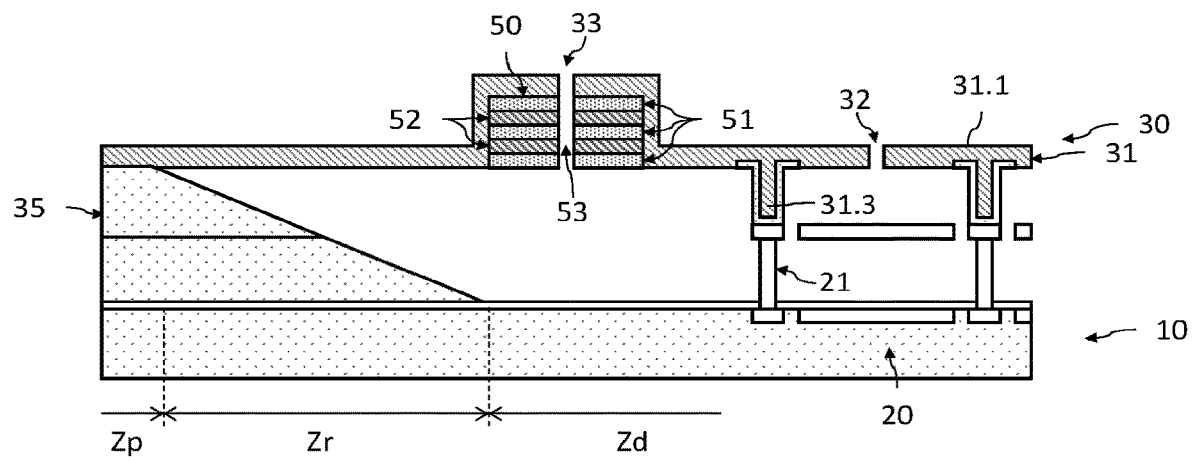
Figure 7C:
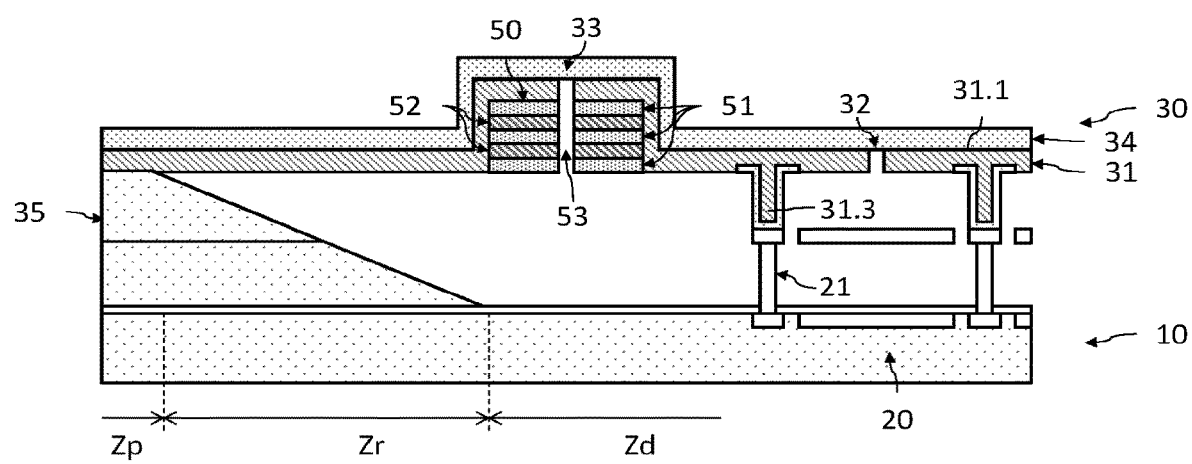

FIGS. 7A to 7C illustrate various steps of a process for fabricating a detecting device 1 according to another variant embodiment. This variant differs from that described with reference to FIGS. 6A to 6C essentially in that the aperture 53 is a through-aperture, thus allowing the mineral sacrificial material of the layers 61 and 62 to be removed through the vents 33 in addition to the vents 32.

FIG. 7A thus illustrates a step in which the vents 32 are produced facing the sensitive detectors 20, and the vents 33 are produced above the getter pads 50. The aperture 53 is made a through-aperture and opens onto the sacrificial layer 62. It may extend partially into this layer 62. In this example, the detecting device does not comprise any dummy detectors 3 under the getter pads 50, but as a variant it may comprise some (as illustrated in FIG. 6A).

FIG. 7B illustrates a step in which the sacrificial layers 61 and 62 are partially removed by wet etching in an acid medium, so as to form the peripheral wall 35. The mineral sacrificial material is here removed through the vents 32 and vents 33.

FIG. 7C illustrates a step in which the sealing layer 34 is deposited on the upper wall 31.1 so as to block the vents 32 and 33.

In this variant, the peripheral wall 35 is set laterally away from the sensitive detectors 20 and the getter pads 50, in so far as the vents 33 had a hand in the removal of the mineral sacrificial material of the layers 61 and 62.

Particular embodiments have just been described. Various modifications and variants will be apparent to a person skilled in the art. The various variants described above may be combined together, notably with respect to the presence or absence of compensating detectors, to the number of protective segments 51 and of getter segments 52 in each getter pad 50, to the number and arrangement of the getter pads 50, etc.

The invention claimed is:

1. A process for fabricating a device for detecting electromagnetic radiation, comprising:
   producing at least one thermal detector configured to detect the electromagnetic radiation, said detector resting on a substrate and being covered by at least one mineral sacrificial layer made of a mineral material that is able to be removed by a first chemical etch;
   producing at least one getter pad, the at least one getter pad:
      extending partially on the mineral sacrificial layer, and being placed away from the at least one thermal detector in a plane parallel to the substrate, and
      being formed from a stack of segments of thin planar layers that are parallel to one another, including a protective segment made of amorphous carbon able to be removed via a second chemical etch and resting in contact with the at least one mineral sacrificial layer, and at least one getter segment made of a getter material resting in contact with the protective segment;
   producing a thin encapsulating layer extending above the at least one thermal detector, the thin encapsulating layer comprising an upper portion that rests on the at least one mineral sacrificial layer and that covers an upper face and sidewalls of the at least one getter pad;
   producing at least one first vent through the thin encapsulating layer, said at least one first vent being located away from the at least one getter pad in a plane parallel to the substrate and opening onto the at least one mineral sacrificial layer;
   removing the at least one mineral sacrificial layer via the first chemical etch, thus freeing a surface of the protective segment;
   removing the protective segment via a second chemical etch, thus freeing a surface of the getter segment; and
   depositing a first thin sealing layer on the thin encapsulating layer, so as to block at least the first vent.

2. The fabricating process according to claim 1, comprising producing at least one compensating detector configured not to receive the electromagnetic radiation to be detected, the at least one getter pad being placed facing the at least one compensating detector.

3. The fabricating process according to claim 2, comprising producing a plurality of thermal detectors and compensating detectors, at least one getter pad being placed facing the compensating detectors.

4. The fabricating process according to claim 2, the at least one thermal detector and the compensating detector each comprising a membrane suspended above the substrate via anchoring pillars, the thin encapsulating layer comprising at least one supporting pillar that is integrally formed with the upper portion, and that extends from the upper portion to rest on one of the anchoring pillars.

5. The fabricating process according to claim 4, comprising producing a layer made of an electrically insulating material, said layer made of an electrically insulating material being placed between and in contact with the at least one supporting pillar and one of the anchoring pillars.

6. The fabricating process according to claim 1, wherein, following producing the thin encapsulating layer, the thin encapsulating layer extends continuously above and around the at least one thermal detector, and is formed from the upper portion and from a peripheral portion, the upper and peripheral portions being integrally formed, the peripheral portion of the thin encapsulating layer extending into a trench produced through the at least one mineral sacrificial layer and making contact with sidewalls thereof, the peripheral portion resting on the substrate.

7. The fabricating process according to claim 1, wherein:
   during producing the at least one thermal detector, the at least one thermal detector rests on a first mineral sacrificial layer, the at least one thermal detector and the first mineral sacrificial layer being covered by a second mineral sacrificial layer, the first and second mineral sacrificial layers being made of a mineral material able to be removed via the first chemical etch;
   the first vent is placed facing the at least one thermal detector; and
   the first chemical etch comprises a wet etch in an acid medium, and during the first chemical etch the first and second mineral sacrificial layers, are partially removed through the first vent, an unetched segment of the first and second mineral sacrificial layers forming a peripheral wall which encircles the at least one thermal detector in a plane parallel to the substrate and on which the upper portion rests.

8. The fabricating process according to claim 7, wherein, following the first chemical etch, the peripheral wall comprises a lateral recess that causes a cavity to widen vertically parallel to the substrate, between the substrate and the upper portion, the lateral recess defining an intermediate region of a surface of the substrate encircling the at least one thermal detector.

9. The fabricating process according to claim 8, comprising producing reinforcing pillars for reinforcing the thin encapsulating layer, said pillars being arranged in the intermediate region around the at least one thermal detector, being separate from one another, and extending from the upper portion to rest on the substrate.

10. The fabricating process according to claim 1, wherein the at least one getter pad comprises a plurality of getter segments that are superposed along an axis perpendicular to the substrate, each getter segment being placed between two protective segments.

11. The fabricating process according to claim 1, wherein the getter segment entirely covers a face of the protective segment opposite the substrate.

12. The fabricating process according to claim 10, wherein, in producing the first vent, at least one second vent is produced through the thin encapsulating layer so as to open onto an upper protective segment that covers said getter segments, then, following removing the at least one mineral sacrificial layer, an aperture is produced from the second vent so as to open onto a lower protective segment, on which said getter segments rest.

13. The fabricating process according to claim 12, wherein a second thin sealing layer is deposited so as to block the second vent, the second thin sealing layer being distinct from the first thin sealing layer blocking the first vent.

14. The fabricating process according to claim 1, wherein the getter pad comprises a plurality of getter segments and a plurality of protective segments, the segments being superposed along an axis perpendicular to the substrate, and wherein a lateral over-etch of the protective segments is carried out selectively with respect to the getter segments.

15. The fabricating process according to claim 1, wherein the at least one mineral sacrificial layer is made of a silicon oxide obtained from a tetraethyl orthosilicate.

16. The fabricating process according to claim 7, wherein the at least one thermal detector comprises a matrix array of thermal detectors, and the first vent is placed facing the matrix array of thermal detectors.

* * * * *